(12) United States Patent
Gambino et al.

(10) Patent No.: US 10,476,227 B2
(45) Date of Patent: Nov. 12, 2019

(54) DUAL BOND PAD STRUCTURE FOR PHOTONICS

(71) Applicant: INTERNATIONAL BUSINESS MACHINES CORPORATION, Armonk, NY (US)

(72) Inventors: Jeffrey P. Gambino, Portland, OR (US); Richard S. Graf, Gray, ME (US); Robert K. Leidy, Burlington, VT (US); Jeffrey C. Maling, Grand Isle, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 72 days.

(21) Appl. No.: 15/407,515

(22) Filed: Jan. 17, 2017

(65) Prior Publication Data
US 2017/0125974 A1 May 4, 2017

Related U.S. Application Data

(62) Division of application No. 14/531,291, filed on Nov. 3, 2014, now Pat. No. 9,608,403.

(51) Int. Cl.
*H01S 5/022* (2006.01)
*H01L 23/482* (2006.01)
*H01L 23/00* (2006.01)

(52) U.S. Cl.
CPC ...... *H01S 5/02272* (2013.01); *H01L 23/4825* (2013.01); *H01L 24/06* (2013.01); *H01L 24/17* (2013.01); *H01L 2224/05573* (2013.01); *H01L 2224/05582* (2013.01); *H01L 2224/0601* (2013.01); *H01L 2224/1403* (2013.01);
(Continued)

(58) Field of Classification Search
CPC .......................... H01L 31/0232; H01S 5/02272
See application file for complete search history.

(56) References Cited

U.S. PATENT DOCUMENTS 5,321,786 A 6/1994 Valette et al.
6,348,742 B1 2/2002 MacPherson
(Continued)

OTHER PUBLICATIONS

Pittroff et al., "Flip chip mounting of laser diodes with Au/Sn solder bumps: bumping, self-alignment and laser behavior", 1997, Proceedings 47th Electronic Components and Technology Conference, pp. 1235-1241 (Year: 1997).*
(Continued)

*Primary Examiner* — Jose R Diaz
(74) *Attorney, Agent, or Firm* — Alvin Borromeo; Andrew M. Calderon; Roberts Mlotkowski Safran Cole & Calderon, P.C.

(57) ABSTRACT

A dual bond pad structure for a wafer with laser die attachment and methods of manufacture are disclosed. The method includes forming a bonding layer on a surface of a substrate. The method further includes forming solder bumps on the bonding layer. The method further includes patterning the bonding layer to form bonding pads some of which comprise the solder bumps thereon. The method further includes attaching a laser diode to selected bonding pads using solder connections formed on the laser diode. The method further includes attaching an interposer substrate to the solder bumps formed on the bonding pads.

20 Claims, 5 Drawing Sheets

(52) U.S. Cl.
CPC ............. *H01L 2224/1703* (2013.01); *H01L 2924/12042* (2013.01); *H01L 2924/152* (2013.01)

(56) References Cited

U.S. PATENT DOCUMENTS

| | | | |
|---|---|---|---|
| 6,642,136 B1* | 11/2003 | Lee | H01L 21/563 257/E21.503 |
| 6,790,691 B2 | 9/2004 | Dudoff et al. | |
| 6,900,545 B1 | 5/2005 | Sebesta et al. | |
| 6,927,156 B2 | 8/2005 | Mathew | |
| 6,989,297 B2 | 1/2006 | Sebesta et al. | |
| 7,262,513 B2 | 8/2007 | Matthew | |
| 7,443,036 B2* | 10/2008 | Iwasaki | H01L 21/563 257/777 |
| 7,729,147 B1 | 6/2010 | Wong et al. | |
| 8,049,236 B2 | 11/2011 | Shi et al. | |
| 8,183,683 B1 | 5/2012 | Kim et al. | |
| 2005/0017355 A1* | 1/2005 | Chou | H01L 24/03 257/738 |
| 2005/0023703 A1 | 2/2005 | Sebesta et al. | |
| 2005/0089264 A1* | 4/2005 | Johnson | G02B 6/12004 385/15 |
| 2007/0184643 A1 | 8/2007 | Rinne | |
| 2007/0217750 A1* | 9/2007 | Budd | G02B 6/42 385/89 |
| 2011/0044367 A1* | 2/2011 | Budd | G02B 6/4201 372/50.21 |
| 2011/0044369 A1 | 2/2011 | Andry et al. | |
| 2015/0228606 A1 | 8/2015 | Chen et al. | |
| 2016/0126695 A1 | 5/2016 | Gambino et al. | |

OTHER PUBLICATIONS

"List of IBM Patents or Patent Applications Treated as Related" 1 page.
Office Action in related U.S. Appl. No. 15/407,498 dated Apr. 5, 2018, 9 pages.
Zhou et al., "Wafer Scale Photonic-die Attachment", Electronic Components and Technology Conference, 1997, pp. 763-767.
Ying et al., "Characterization of AuSn Solder in Laser Die Attachment for Photonic Packaging Applications", Electronics Packaging Technology Conference, 9th Edition, 2007, pp. 370-373.
Green et al., "Silicon Photonic Wire Circuits for On-Chip Optical Interconnects", Proc. of SPIE, vol. 6883, 2008, 10 pages.
Final Office Action dated Aug. 31, 2018 in related U.S. Appl. No. 15/407,498, 12 pages.
Office Action dated Jan. 18, 2019 in related U.S. Appl. No. 15/407,498, 16 pages.
Final Office Action dated Jul. 31, 2019 in related U.S. Appl. No. 15/407,498, 5 pages.

* cited by examiner

DUAL BOND PAD STRUCTURE FOR PHOTONICS

FIELD OF THE INVENTION

The invention relates to semiconductor structures and, more particularly, to a dual bond pad structure for a wafer with laser die attach and methods of manufacture.

BACKGROUND

Silicon photonics chips are developed for high speed interconnects between dies. Waveguides can be built on silicon on insulator (SOI) wafers and can be integrated with CMOS devices; however, this requires a connection be made between a laser and the waveguide, which is a difficult from both a structural standpoint and a fabrication processing standpoint. For example, the laser die is attached to the wafer using a solder bump, but solder bump height for the laser must be smaller than that of other solder bumps connecting to an interposer. Thus, different solder bump processes must be used for attachment of the laser to the wafer, increasing fabrication time and costs.

SUMMARY

In an aspect of the invention, a method comprises forming a bonding layer on a surface of a substrate. The method further comprises forming solder bumps on the bonding layer. The method further comprises patterning the bonding layer to form bonding pads some of which comprise the solder bumps thereon. The method further comprises attaching a laser diode to selected bonding pads using solder connections formed on the laser diode. The method further comprises attaching an interposer substrate to the solder bumps formed on the bonding pads.

In an aspect of the invention, a method comprises: forming a bonding layer on a substrate; patterning the bonding layer with two different masks to form bonding pads for connecting an interposer substrate and a laser diode; forming solder bumps on a set of the bonding pads, using one of the masks patterned to have openings corresponding to the set of the bonding pads; attaching the laser diode to another set of the bonding pads by a reflow process of solder connections attached to the laser diode; and reflowing the solder bumps to connect the interposer substrate to the set of the bonding pads after the attaching of the laser diode.

In an aspect of the invention, a structure comprises: a first set of bond pads and a second set of bond pads; solder bumps electrically connected to the first set of bond pads, the solder bumps having a first height; an interposer substrate electrically connected to the solder bumps; and solder connections electrically connected to a laser diode and the second set of bond pads, the solder connections having a second height smaller than the first height and the laser diode being positioned below the interposer substrate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a dual bond pad structure for a wafer with laser die attach and methods of manufacture. More specifically, the present invention provides fabrication processes and resultant structures for bonding both a laser die and an interposer substrate with solder bump processes. Advantageously, the processes of the present invention can minimize the number of masks needed in order to form the bonds pads for both a laser die (diode) and an interposer substrate.

The dual bond pad structure of the present invention can be manufactured in a number of ways using a number of different tools. In general, though, the methodologies and tools are used to form structures with dimensions in the micrometer and nanometer scale. The methodologies, i.e., technologies, employed to manufacture the bond pad structure of the present invention have been adopted from integrated circuit (IC) technology. For example, the structures of the present invention are built on wafers and are realized in films of material patterned by photolithographic processes on the top of a wafer. In particular, the fabrication of the dual bond pad structure of the present invention uses three basic building blocks: (i) deposition of thin films of material on a substrate, (ii) applying a patterned mask on top of the films by photolithographic imaging, and (iii) etching the films selectively to the mask.

Figure 1:
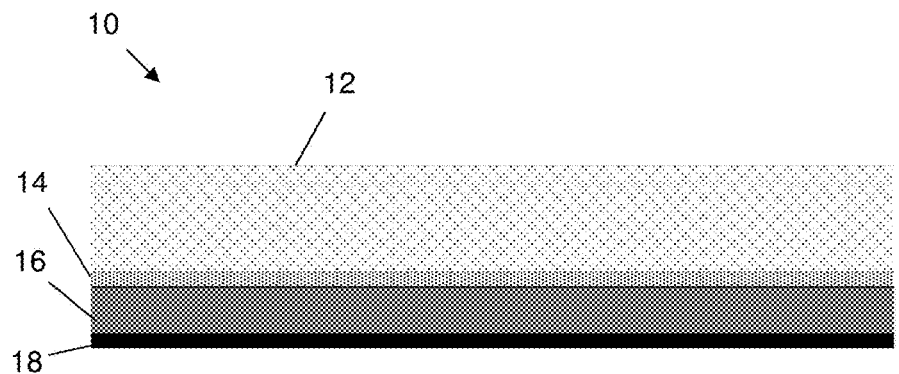
FIGS. 1-6 show fabrication processes and respective structures in accordance with aspects of the present invention.

FIG. 1 shows a structure and respective fabrication processes in accordance with aspects of the present invention. In embodiments, the structure 10 includes a silicon on insulator wafer, comprising an oxide or other insulator layer 14 bonded or otherwise attached to a wafer 12 (e.g., silicon substrate). In embodiments, the insulator layer 14 can be a buried oxide layer.

The structure 10 further includes front end of the line (FEOL) structures and back end of the line (BEOL) structures, generally represented at reference numeral 16. In embodiments, the FEOL structures comprise any combination of active and passive devices such as, for example, field effect transistors (FETs) and waveguide structures (with diffusers); although other devices are also contemplated by the present invention. The BEOL structures can comprise any combination of wiring and interconnect structures, for example. The FEOL and BEOL structures can be formed using conventional CMOS technologies comprising lithography, etching and deposition of materials as should be understood by those of skill in the art.

Still referring to FIG. 1, a bond pad layer 18 is deposited on a surface of an uppermost BEOL layer. For example, the bond pad layer 18 can be deposited on an oxide film (or other interlevel dielectric material), in electrical connection with wiring layers of the BEOL structures. The bond pad layer 18 can comprise plural layers deposited using sputtering techniques, as well as other deposition processes such as physical vapor deposition (PVD), etc. In embodiments, the bond pad layer 18 can comprise, as an example, TiW/Cu/Ni; although other bonding materials are also contemplated by the present invention.

Figure 2:
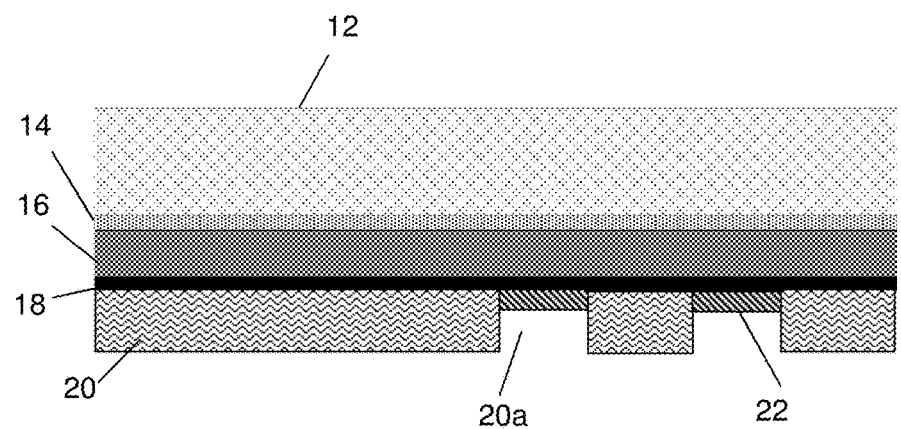

In FIG. 2, a resist 20 is formed over the bond pad layer 18. The resist is then patterned by exposure to energy (light) to form openings 20a. A metal plate (portion of subsequently formed bond pad) 22 is then formed within the openings 20a. The metal plate 22 will act as a bond pad for a laser die (diode). In embodiments, the metal plate 22 can be a gold pad, formed by an electroplating process. In embodiments, the metal plate 22 can be other materials such as, for example, Nickel, Copper, Platinum, etc. The resist 20 can then be removed using conventional processes, e.g., oxygen ashing techniques.

Figure 3:
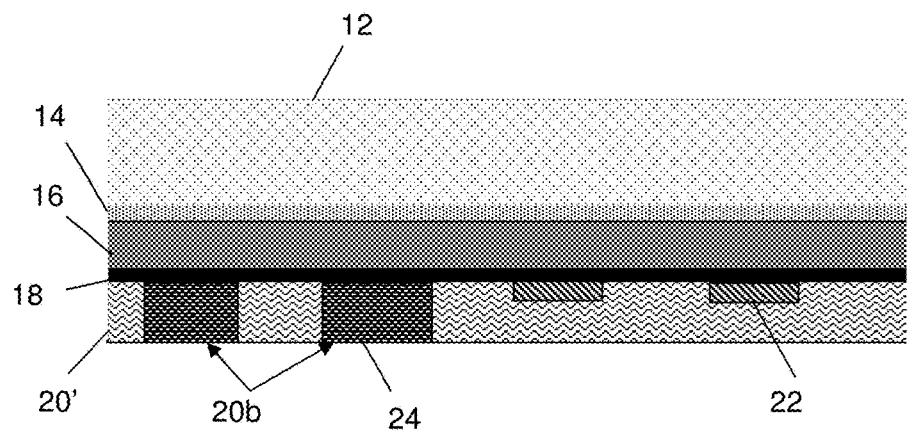

In FIG. 3, a resist 20' is formed on the bond pad layer 18 and the metal plate 22. The resist is then patterned by exposure to energy (light) to form openings 20b. A solder bump 24 is formed within the openings 20b, on the bond pad layer 18. The solder bump 24 can be a controlled collapse chip connection (C4) for interconnecting an interposer substrate to the underlying wafer and its circuitry. In embodiments, the solder bump 24 can be a tin-based alloy or a copper pillar, deposited using electroplating processes. The resist 20' can then be removed using conventional processes, e.g., oxygen ashing techniques.

Figure 4:
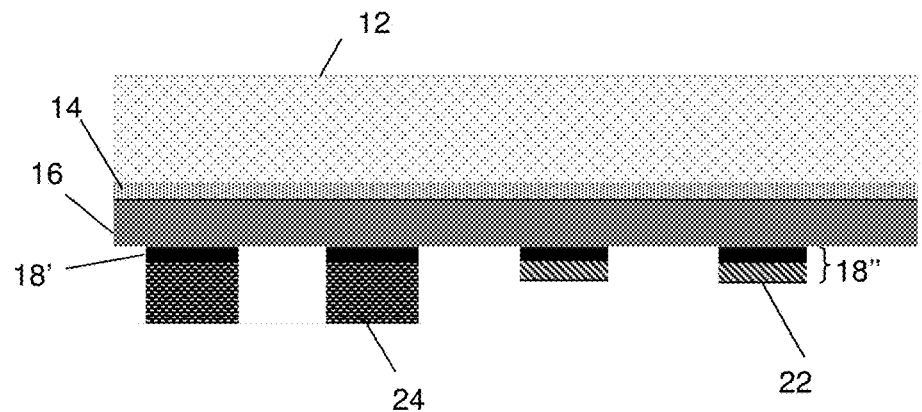

As shown in FIG. 4, the bond pad layer 18 can be patterned, to form discrete bond pads 18' and 18". The bond pads 18' and 18" can be electrically isolated from one another. The patterning can be performed using conventional wet etching processes, with selective chemistries to the materials of the bond pad layer 18.

Figure 5:
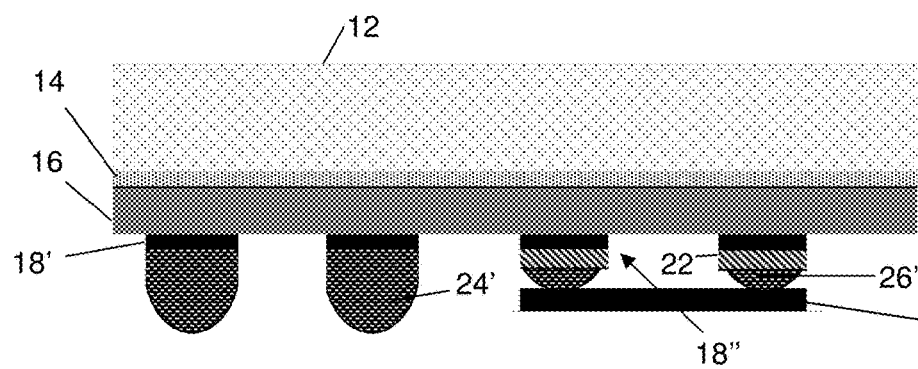

FIG. 5 shows the connection of a laser die (diode) 26 to the bond pads 18", formed in the processes described above. In embodiments, the laser diode 26 includes a solder bump 26' formed on the laser diode devices, which is electrically connected (attached) to the bond pads 18" during a reflow process as should be understood by those of skill on the art. The reflow process can also reflow the solder bump 24'. In embodiments, the laser diode 26 can be aligned with the bond pads 18" using known pick and place processes. As in each of the embodiments, the solder bump 26' will be of a different height than the solder bump 24', preferably of a smaller height, and the bond pads will be discrete bond pads electrically isolated from one another on the surface of the substrate.

Figure 6:
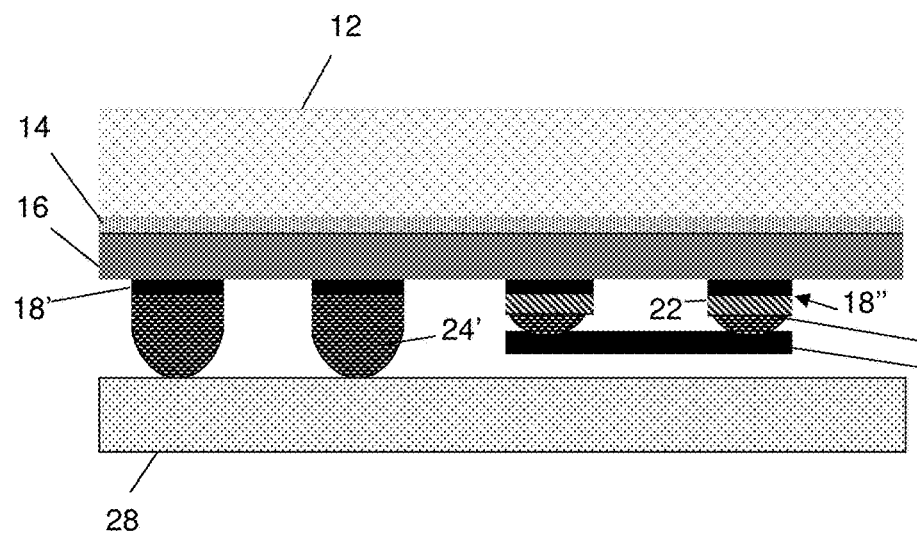

In FIG. 6, thereafter, the interposer substrate 28 is connected to the solder bump 24' through a reflow process as is known to those of skill in the art. In this way, it is now possible to connect both the interposer substrate 28 and the laser diode 26 to the wafer using a dual bond pad fabrication process, with different height solder bumps for the interposer substrate 28 and the laser diode 26. As shown in this embodiment and which may be applicable for each of the subsequently described embodiments, the interposer substrate 28 is positioned above the laser diode 26.

Figure 7:
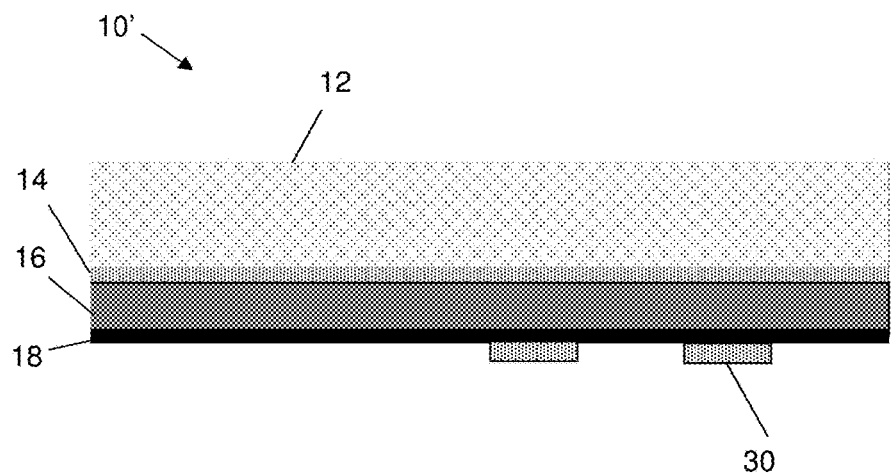
FIGS. 7-10 show fabrication processes and respective structures in accordance with additional aspects of the present invention.

FIGS. 7-10 show fabrication processes and respective structures in accordance with additional aspects of the present invention. More specifically, FIG. 7 shows a structure 10' similar to that of FIG. 1, which includes a silicon on insulator wafer, comprising an oxide or other insulator layer 14 bonded or otherwise attached to the wafer 12. The structure 10 further includes front end of the line (FEOL) structures and back end of the line (BEOL) structures, generally represented at reference numeral 16. A bond pad layer 18 is deposited on a surface of an uppermost BEOL layer, as described with respect to FIG. 1 such that no further explanation is required.

Still referring to FIG. 7, a masking layer 30 is patterned on the bond pad layer 18. For example, a silicon nitride or SiO$_2$ can be deposited on the bond pad layer 18 using conventional deposition processes, e.g., CVD, PECVD, etc. A resist is formed over the masking layer 30, which is then patterned by exposure to energy (light) to form openings. An etching process is then performed through the openings to remove exposed masking layer material, resulting in the pattern of the masking layer 30 shown in FIG. 7. The resist can then be removed using conventional processes, e.g., oxygen ashing techniques.

Figure 8:
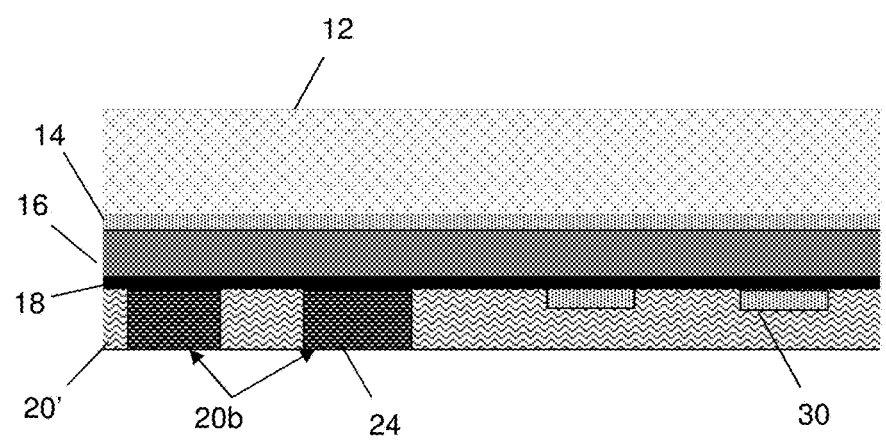

In FIG. 8, a resist 20 is formed over the bond pad layer 18 and the masking layer 30. The resist is then patterned by exposure to energy (light) to form openings 20b. A solder bump 24 is then formed within the openings 20b, on the bond pad layer 18. The solder bump 24 can be a controlled collapse chip connection (C4) for interconnecting an interposer substrate to the underlying wafer and its circuitry. In embodiments, the solder bump 24 can be a tin-based alloy or a copper pillar, deposited using electroplating processes. The resist 20 can then be removed using conventional processes, e.g., oxygen ashing techniques.

Figure 9:
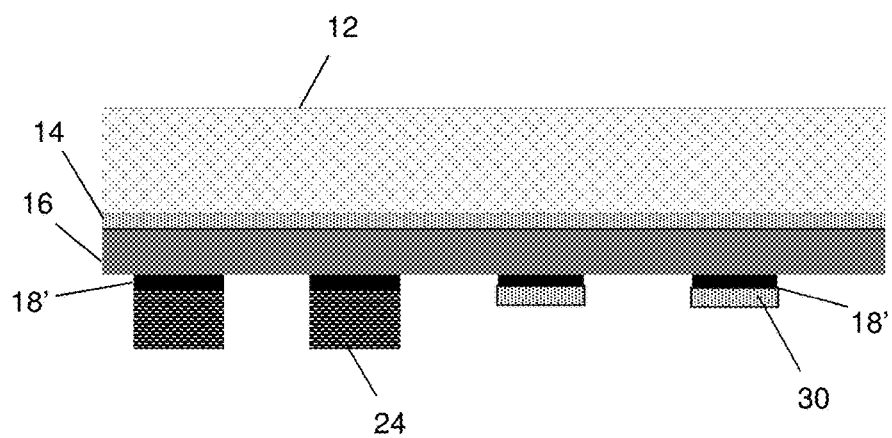

As shown in FIG. 9, the bond pad layer 18 can be patterned to form discrete bond pads 18', 18". In this embodiment, the bond pads 18' and 18" comprise the bond pad layer 18, only. The patterning can be performed using conventional reactive ion etching processes, with selective chemistries to the materials of the bond pad layer 18. In embodiments, the masking layer 30 and the solder bump 24 will protect the bond pads 18', 18" during this selective etching process. The masking layer 30 can then be removed using conventional etching processes, known to those of skill in the art.

Figure 10:
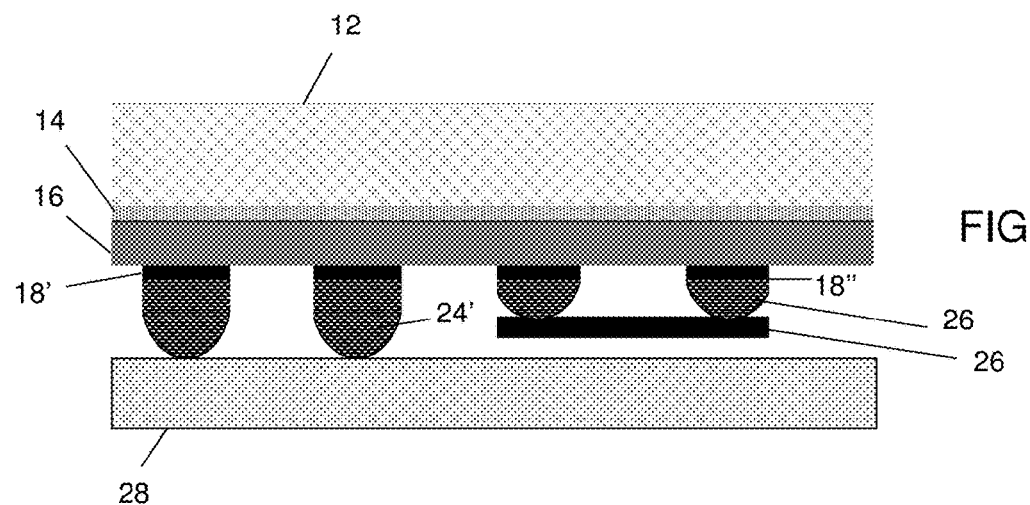

FIG. 10 shows the connection of the laser diode 26 and interposer substrate 28, similar to that already described with respect to FIGS. 5 and 6. Specifically, the laser diode 26 is attached to the bond pads 18" during a reflow process of the solder bump 26'. The reflow process can also reflow the solder bump 24'. In embodiments, the laser diode 26 can be aligned with the bond pads 18" using known pick and place processes. Thereafter, the interposer substrate 28 is connected to the solder bump 24' through a reflow process as is known to those of skill in the art. In this way, it is now possible to connect both an interposer substrate 28 and a laser diode 26 to the wafer using a dual bond pad fabrication process, with different height solder bumps for both the interposer substrate 28 and the laser diode 26.

Figure 11:
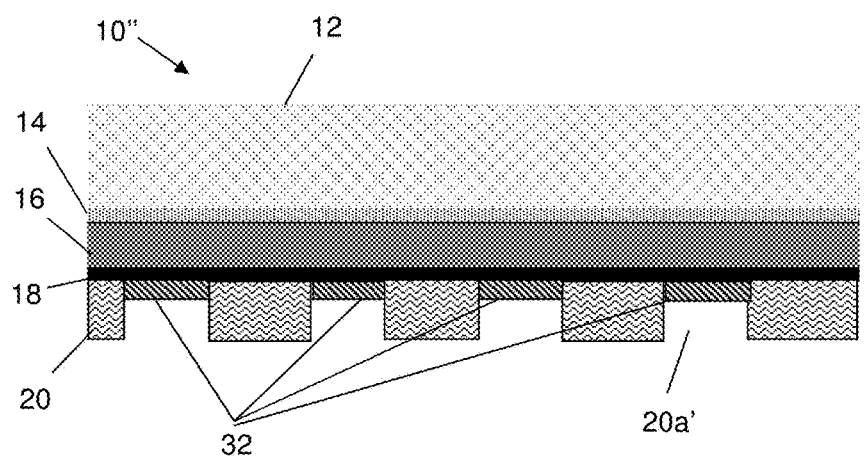
FIGS. 11-13 show fabrication processes and respective structures in accordance with additional aspects of the present invention.
Figure 12:
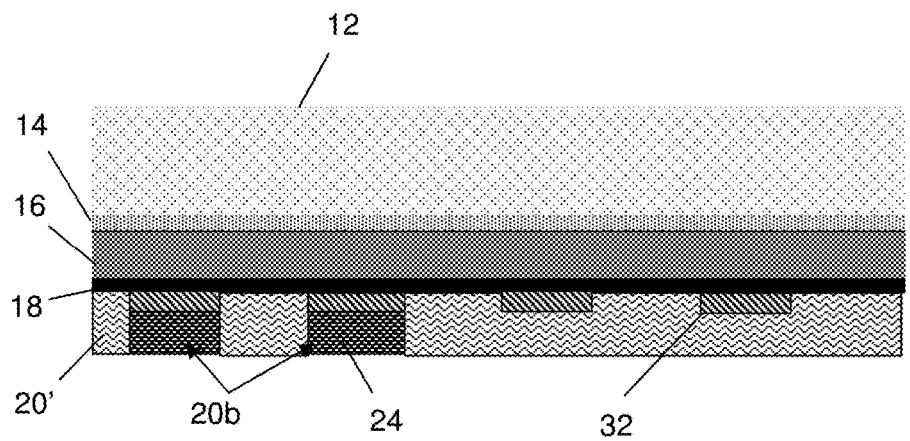
Figure 13:
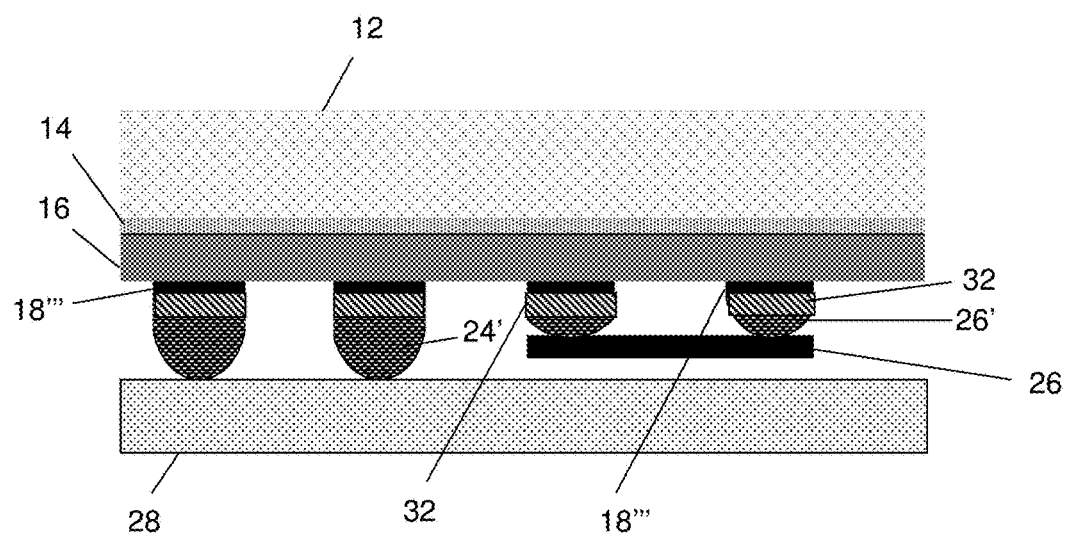

FIGS. 11-13 show fabrication processes and respective structures in accordance with additional aspects of the present invention. More specifically, FIG. 11 shows a structure 10" similar to that of FIG. 1, which includes a silicon on insulator wafer, comprising an oxide or other insulator layer 14 bonded or otherwise attached to the wafer 12. The structure 10 further includes front end of the line (FEOL) structures and back end of the line (BEOL) structures, generally represented at reference numeral 16. A bond pad layer 18 is deposited on a surface of an uppermost BEOL layer, as described with respect to FIG. 1 such that no further explanation is required.

Still referring to FIG. 11, a resist 20 is formed over the bond pad layer 18. The resist is then patterned by exposure to energy (light) to form openings 20a'. A metal plate 32 is then formed in within the openings 20a'. The metal plate 32 will act as a bond pad for both the laser diode and the interposer substrate, as described herein. In embodiments, the metal plate 32 can be plural layers or a single layer of metal. For example, the metal plate can be a nickel and gold pad, formed by an electroplating process. In embodiments, the metal plate 32 can be other materials such as, for example, Nickel, Copper, Platinum, etc., or any combinations thereof. The resist 20 can then be removed using conventional processes, e.g., oxygen ashing techniques.

In FIG. 12, a resist 20' is formed on the bond pad layer 18 and the metal plate 32. The resist is then patterned by exposure to energy (light) to form openings 20b exposing the metal plate on an interpose connection side of the structure. A solder bump 24 is then formed within the openings 20b, on the metal plate 32. The solder bump 24 can be a controlled collapse chip connection (C4) for interconnecting an interposer to the underlying wafer and its circuitry. In embodiments, the solder bump 24 can be a tin-based alloy or a copper pillar, deposited using electroplating processes. The resist 20' can then be removed using conventional processes, e.g., oxygen ashing techniques.

As shown in FIG. 13, the bond pad layer 18 can be patterned, to form discrete bond pads 18' comprising the bond pad layer 18 and the metal plate 32. The patterning can be performed using conventional reactive ion etching processes, with selective chemistries to the materials of the bond pad layer 18. The laser diode 26 and interposer substrate 28 can be connected to the bond pads 18''', similar to that already described with respect to FIGS. 5 and 6. Specifically, the laser diode 26 is attached to the bond pads 18''' during a reflow process of the solder bump 26'. The reflow process can also reflow the solder bump 24'. In embodiments, the laser diode 26 can be aligned with the bond pads 18' using known pick and place processes. Thereafter, the interposer substrate 28 is connected to the solder bump 24' through a reflow process as is known to those of skill in the art. In this way, it is now possible to connect both an interposer substrate 28 and a laser diode 26 to the wafer using a dual bond pad fabrication process, with different height solder bumps for both the interposer substrate 28 and the laser diode 26.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a bonding layer on a substrate;
   forming solder bumps on the bonding layer;
   forming a masking layer over the bonding layer;
   patterning the bonding layer to form bonding pads some of which comprise the solder bumps thereon;
   attaching a laser diode to selected bonding pads using solder connections formed on the laser diode such that the laser diode is unobstructed by the solder bumps; and
   attaching an interposer substrate to the solder bumps formed on the bonding pads such that the interposer substrate is spaced away and disconnected from the laser diode.

2. The method of claim 1, wherein the masking layer is formed over portions of the bonding layer which are to be attached to the laser diode.

3. The method of claim 1, wherein the solder bumps are formed through a resist pattern, after the forming of the masking layer over the bonding layer.

4. The method of claim 1, wherein the patterning of the bonding layer is performed after the forming of the solder bumps, such that the solder bumps and the masking layer protect underlying portions of the bonding layer during an etching process.

5. The method of claim 1, further comprising removing the masking layer and attaching the solder connections formed on the laser diode directly to the bonding pads which are formed underneath the masking layer prior to removal.

6. The method of claim 1, wherein the interposer substrate is attached to the solder bumps through a reflow process.

7. The method of claim 1, wherein the laser diode has a first surface and a second surface, the first surface being attached to the selected bonding pads during a reflow process, wherein the second surface is devoid of any bonded attachments.

8. The method of claim 7, wherein the interposer substrate is attached to the solder bumps through a reflow process that is performed after the reflow process to attach the laser diode, forming a gap between a surface of the interposer substrate and the second surface of the laser diode.

9. A method, comprising:
   forming a bonding layer on a substrate;
   forming a masking layer over portions of the bonding layer;
   patterning the bonding layer to form bonding pads for connecting an interposer substrate and a laser diode;
   forming solder bumps on a set of the bonding pads;
   attaching the laser diode to another set of the bonding pads on a side of the solder bumps by a reflow process of solder connections attached to the laser diode such that the laser diode is spaced away and disconnected from the interposer substrate and is unobstructed by the solder bumps; and
   reflowing the solder bumps to connect the interposer substrate to the set of the bonding pads after the attaching of the laser diode.

10. The method of claim 9, wherein the masking layer is formed over portions of the bonding layer which are to be attached to the laser diode.

11. The method of claim 9, wherein:
   the solder bumps are formed after the forming of the masking layer over the portions of the bonding layer which are to be attached to the laser diode; and
   the patterning of the bonding layer is performed before the forming of the solder bumps.

12. The method of claim 9, further comprising removing the masking layer and attaching the solder connections attached to the laser diode directly to the bonding pads which were formed underneath the masking layer prior to removal.

13. The method of claim 8, wherein the attaching the interposer substrate to the solder bumps comprises a controlled collapse chip connection.

14. The method of claim 13, further comprising forming a metal plate on the selected bonding pads.

15. The method of claim 14, wherein the forming the solder bumps comprises forming the solder bumps at different heights.

16. The method of claim 15, further comprising forming an insulator layer on the substrate.

17. The method of claim 16, further comprising forming front end of the line (FEOL) structures and back end of the line (BEOL) structures on the insulator layer.

18. The method of claim 17, wherein the forming the bonding layer comprises depositing the bonding layer on a surface of an uppermost BEOL layer of the BEOL structures.

19. The method of claim 18, wherein the depositing the bonding layer on the surface of the uppermost BEOL layer comprises depositing the bonding layer on an interlevel dielectric material in electrical connection with wiring layers of the BEOL structures.

20. The method of claim 19, wherein the depositing the bonding layer on the interlevel dielectric material comprises depositing plural layers using sputtering techniques.

* * * * *